(12) United States Patent
Masud

(10) Patent No.: US 6,516,449 B2
(45) Date of Patent: Feb. 4, 2003

(54) METHODOLOGY TO CREATE INTEGRATED CIRCUIT DESIGNS BY REPLICATION MAINTAINING ISOMORPHIC INPUT OUTPUT AND FAULT BEHAVIOR

(75) Inventor: Manzer Masud, Santa Clara, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 45 days.

(21) Appl. No.: 09/824,495

(22) Filed: Apr. 2, 2001

(65) Prior Publication Data

US 2002/0174404 A1 Nov. 21, 2002

(51) Int. Cl.[7] .............................................. G06F 17/50
(52) U.S. Cl. ................. 716/3; 716/12; 716/18
(58) Field of Search ................. 716/1–3, 5, 7, 716/12, 18

(56) References Cited

U.S. PATENT DOCUMENTS 5,787,012 A * 7/1998 Levitt ........................... 716/1
6,023,566 A * 2/2000 Belkhale et al. ................ 716/2
6,408,422 B1 * 6/2002 Hwang et al. .................. 716/3

* cited by examiner

*Primary Examiner*—Tuan T. Lam
*Assistant Examiner*—Long Nguyen
(74) *Attorney, Agent, or Firm*—Hamilton & Terrile, LLP; Stephen A. Terrile

(57) ABSTRACT

The present invention teaches a method for designing an integrated circuit. The design of the integrated circuit is replicated a number of times. The number of times must be odd. The input signals to the original module are also replicated. The replicated modules are configured to respectively receive the replicated input signals. A number of exclusive or gates is provided. The exclusive or gates receive the output signals from the replicated modules. The output signals from the replicated modules are compared to the output signals from the original module. The method is applicable to a bi-directional integrated circuit. Embodiments include the software to replicate the design. Another embodiment includes a computer system for replicating the design. Also, integrated circuits designed by the method described are included within the scope of the disclosure. Another embodiment includes designs produced by the method.

19 Claims, 3 Drawing Sheets

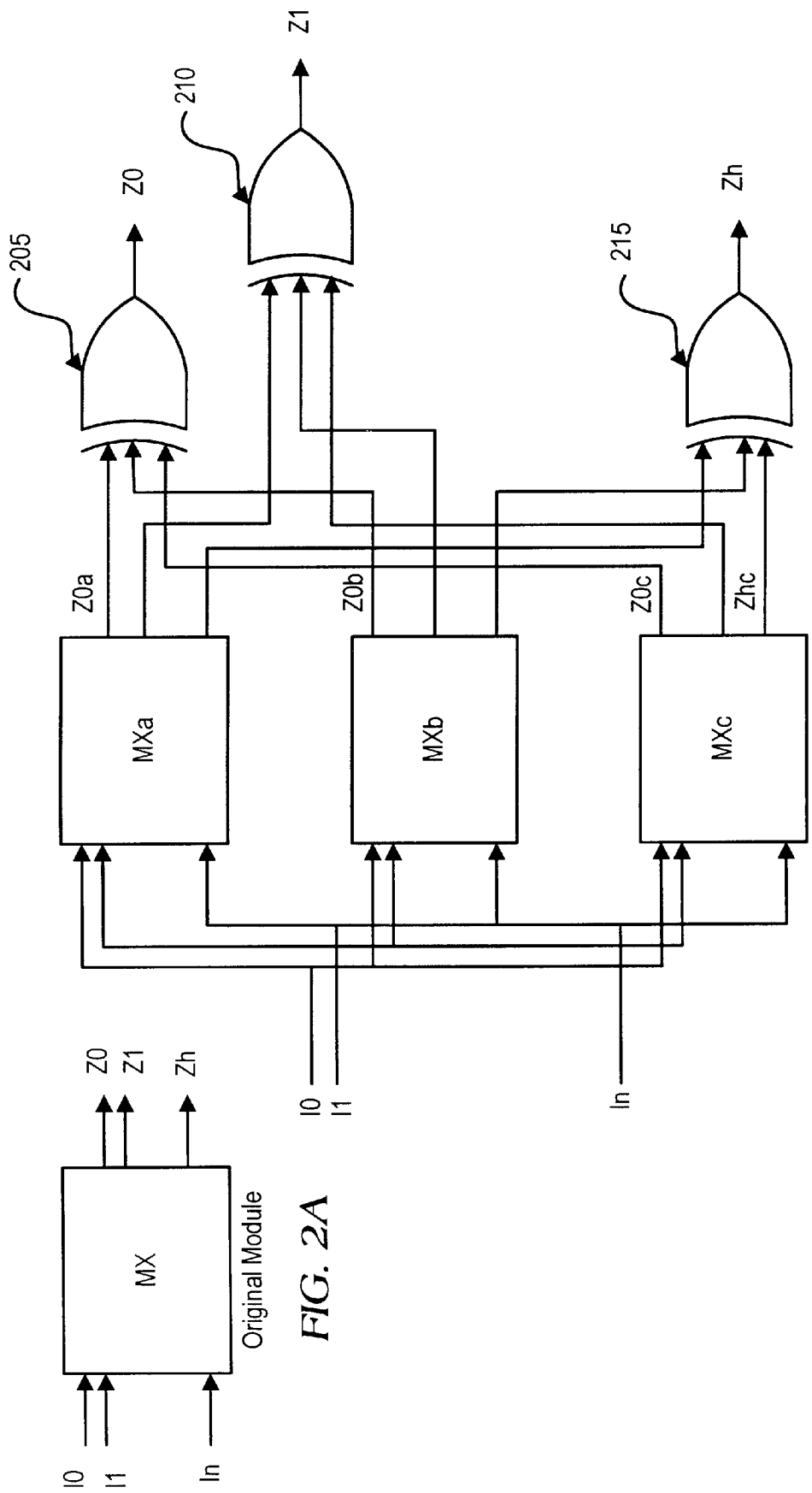

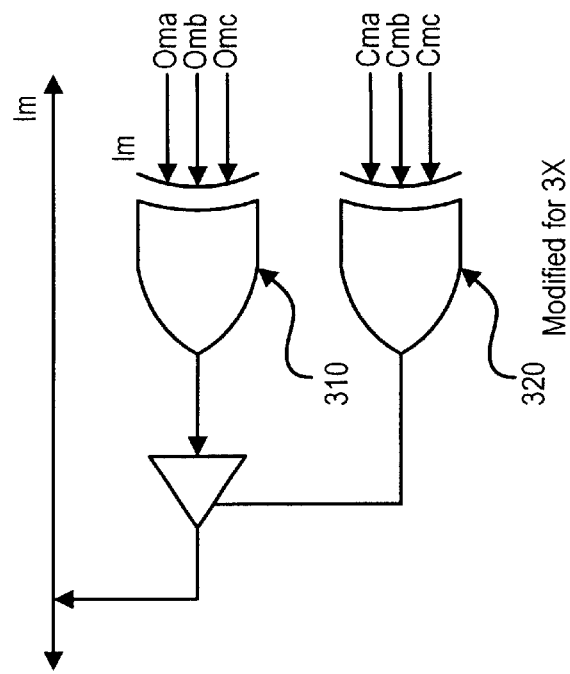
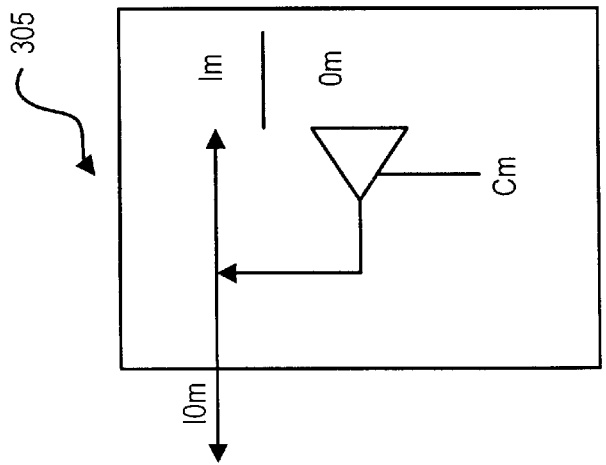
*FIG. 3B*
*FIG. 3A (Prior Art)*

METHODOLOGY TO CREATE INTEGRATED CIRCUIT DESIGNS BY REPLICATION MAINTAINING ISOMORPHIC INPUT OUTPUT AND FAULT BEHAVIOR

BACKGROUND OF THE INVENTION

1. Field of the Invention

The present invention relates to scaling a design of an integrated circuit. More specifically, the present invention relates to accurately replicating the design of integrated circuit modules.

2. Description of the Related Art

A microprocessor is a central processing unit of a computer or other device using thousands (or millions) of gates, flip-flops and memory cells. Memory cells are modified versions of basic logic (and, or, xor) gates. Gates are combinations of high-speed electronic switches.

Digital circuits, no matter how complex, are composed of a small group of identical building blocks. These blocks are either basic gates or special circuits such as Schmitt triggers, special memory cells and other structures for which gates are less suitable. But the majority of digital circuits are composed of gates or combinations of gates. A flip-flop, for example, can be considered as a function block, but it is composed of interconnected gates.

Boolean algebra provides information otherwise found in a truth table as equations. Boolean algebra is used to determine alternate logic structures that will perform a desired function. Gates are the electronic equivalent of simple conventional switches connected in series or parallel. Various systems combine groups of these series and parallel switches. A logic diagram shows how logic gates are interconnected. A system can be designed to accomplish a specific function using logic diagrams, truth tables and Boolean algebra. Boolean algebra provides the means to ensure that any given logical requirement is satisfied using a minimum number of gates.

It is known to use commercially available software to model certain features of processor design in software. For example, Table 1 represents the design of a circuit having seven gates in a common language, Verilog, available from Cadence, Inc. in San Jose, Calif.

TABLE 1

| Module orig(I00, Z0, Z1, 22, 10, 11, 12); | |
|---|---|
| Inout 100; | design of integrated |
| Output Z0, Z1, Z2; | circuit with seven gates |
| Input 10, 11, 12; | |
| and g0 (Z0, I0, I1); | |
| or g1 (Z1, I1, I2); | |
| and g2 (A, 10, 11, 12); | |
| not g3 (B, 100); | |
| not g4 (C, 10); | |
| bufifl g5 (I00 C, A); | |
| buf g6 (Z2, B); | |
| endmodule | |
| Page 1 | |

It is known that software tools can be used to model the design of many integrated circuits. For example, Verilog is a hardware description language (HDL) which can be used to describe digital systems at various levels of abstraction. Verilog is the most predominantly used HDL in the United States. Verilog was originally designed by Gateway Design Automation in approximately 1985. Verilog was made available to the public in 1990 and has been adopted as a standard by the Institute of Electrical and Electronic Engineers (IEEE).

Electronic design automation (EDA) tools were originally designed to simulate logic. As electronic design tools became more popular, vendors began to provide enhanced functions. EDA tools are now used to drive synthesis, timing, simulation, test and other tools. Software tools used to test integrated circuit chips are logic simulator, fault simulator and automatic test pattern generator (ATPG). Other vendors of software tools are: Mentor Graphics (www.Mentor.com), Wilsonville, Oreg.; Snyopsys (www.Synopsys.com), Moutain View, Calif.; and Snytest Technologies, Inc. (www.Snytest.com), Sunnyvale, Calif. These corporations are listed as examples only, other manufactures use proprietary tools for the same purpose.

Due to the logical functions performed by many integrated circuits, the design of these circuits can be replicated to produce circuit designs with more gates. What is needed is a method of modeling which will accurately generate a large design by replicating an existing design while preserving the logic and fault behavior. Accurately replicating a design allows a integrated circuit design to be generated in less time and with less errors.

SUMMARY OF THE INVENTION

The present invention teaches a method for designing an integrated circuit. The design of the integrated circuit is replicated a number of times. The number of times must be odd. The input signals to the original module are also replicated. The replicated modules are configured to respectively receive the replicated input signals. A number of exclusive or gates is provided. The exclusive or gates receive the output signals from the replicated modules. The output signals from the replicated modules are compared to the output signals from the original module. The method is applicable to a bi-directional integrated circuit.

Embodiments include the software to replicate the design. Another embodiment includes a computer system for replicating the design. Also, integrated circuits designed by the method described are included within the scope of the disclosure. Another embodiment includes designs produced by the method.

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features, and advantages made apparent to those skilled in the art by referencing the accompanying drawings.

FIG. 2A depicts the integrated circuit module to be replicated by implementing the present invention. FIG. 2B depicts replicating the integrated circuit module three times according to an implementation of the present invention. More specifically, FIG. 2B depicts the outputs of the replicated module used as an input to three exclusive OR gate.

FIG. 3A depicts a bi-directional integrated circuit according to the prior art. As found in the prior art, the bi-directional integrated circuit has a signal which can be either an input signal or an output signal. FIG. 3B depicts the bi-directional integrated circuit with each control signal and each input signal used as an input to an exclusive OR gate.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

The AND gate is the electronic equivalent of series-connected switches. The AND gate will produce a one output if and only if there is a logical one on all inputs. The Boolean representation of the AND gate is f=A·B and is read f=A and B.

The OR gate (sometimes called an inclusive OR) is the electronic equivalent of switches connected in parallel. A logic one on one or more inputs will produce a one output. The OR gate will only have a zero output when all inputs are zero. The OR gate operation is referred to as a Boolean sum. The Boolean or operations is represented: f=A+B, should not to be confused with the arithmetic operation. The OR gate can have any number of inputs.

Similarly, an exclusive OR (XOR) gate produces a logical output of one when the inputs are different. If an even number of the inputs are one, then an exclusive OR gate produces an output of zero. Similarly, if an odd number of inputs are one, then the output of the exclusive OR gate is 1. The exclusive-or function is primarily defined on two inputs as follows: the output is true (or 1) if either but not both inputs are true and the output is false (or 0) if both inputs are false or if both inputs are true. Assuming the inputs are A and B, and the output is Z, the equation is:

$$Z=(\sim A \& B)+(A \& \sim B);\qquad\text{Equation 1}$$

Equation 1 is read, Z is (not A and B) or (A and not B). Now, using the @ symbol to represent the exclusive-or function and assume inputs; I0, I1, I2, . . . In. Then we have:

$$@(I0, I1, I2, \ldots In)=@(I0, I1, I2, \ldots In-1)@In;\qquad\text{Equation 2}$$

It can be proved based on the original definition of the two-input exclusive-or function that in a multiple input exclusive-or function the output is true if and only if odd number of inputs are true. Multiple-input exclusive-or gates can be constructed out of two-input gates as depicted in FIG. 1.

Figure 1B:
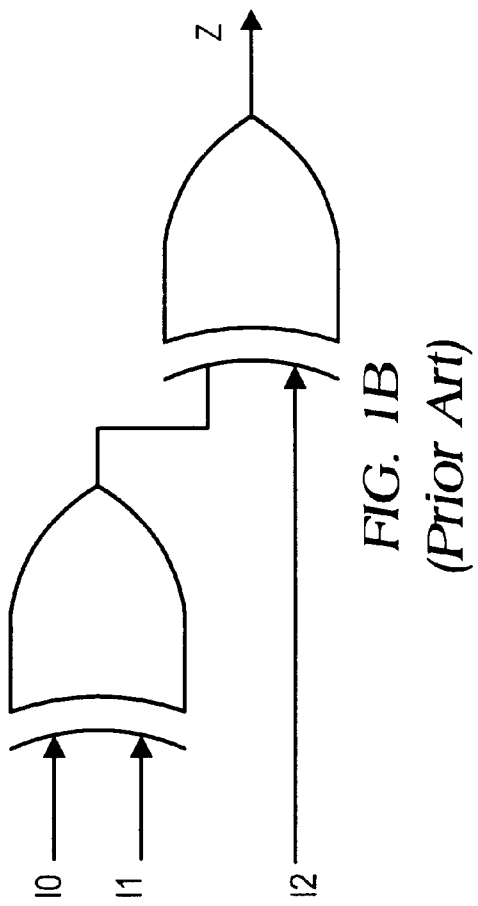
FIG. 1B depicts two multiple-input exclusive-or gates as found in the prior art.
Figure 1A:
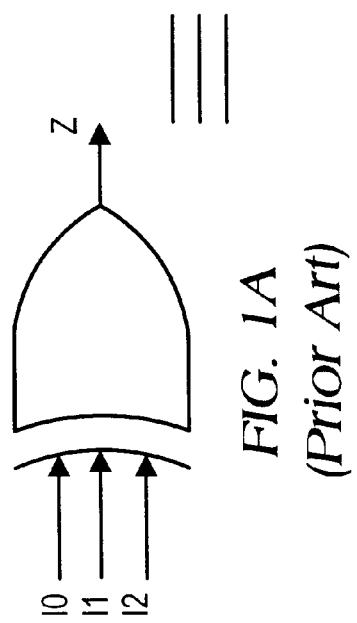
FIG. 1A depicts an exclusive-or gate as found in the prior art.

FIG. 1 can be logically represented as follows:

$$@(I0, I1, I2)=(I0@I1)@ I2\qquad\text{Equation 3}$$

Following is a logical proof that the proposed structure will produce the same set of outputs for the same set of inputs (logically isomorphic). According to the following proof, the number of replications of the module is odd. Each module has identical inputs thus their outputs will be identical. The corresponding output of each replicated module is connected to the corresponding exclusive-or gates (as shown in FIG. 2). As shown in FIG. 2, let module MX have inputs I0, I1, . . . In and outputs Z0, Z1, . . . Zm. The inputs of the replicated modules MXa, MXb, and MXc will be identical to the inputs of the original module MX. That is, the inputs will be I0, I1, . . . In. Identify outputs of the replicated module MXa as Z0a, Z1a, . . . Zma. Identify outputs of the replicated module MXb as Z0b, Z1b, . . . Zmb and Z0c. Identify outputs of replicated module MXc as Z1c, . . . Zmc. Still referring to FIG. 2, each output is connected to the corresponding exclusive-or gate. The outputs of the exclusive-or gates are labeled as Z0, Z1, . . . , Zm. The final output equations are:

$$Z0=Z0a@Z0b@Z0c\qquad\text{Equation 4}(a)$$

$$Z1=Z1a@Z1b@Z1c\qquad\text{Equation 4}(b)$$

$$Zm=Zma\ @Zmb\ @Zmc\qquad\text{Equation 4}(c)$$

As shown below, the output (Z0, Z1, . . . Zm) of the larger (replicated) design is identical to the original module (referred to in FIG. 2 as MX). The inputs of the replicated modules MXa, MXb, and MXc are identical to the inputs of the original module MX by construction. The modules MXa, MXb, and MXc are identical to module MX because they are constructed by replicating the original module Mx. Therefore the signals Z0a Z0b Z0c; similarly Z1a=Z1b=Z1c; . . . ; Zma=Zmb=Zmc.

If a signal Zk in the original module MX is 1 then the corresponding signal Zka, Zkb, and Zkc will also be 1. And the resultant signal (Zka@Zkb@Zkc) will also be 1; because odd number of inputs are 1. Similarly, if Zk is 0 then Zka@Zkb@Zkc will also be 0. This proof holds as long as the number of replicated module is odd.

A fault model specifies the behavior of a model in the presence of manufacturing defects. Stuck-at fault model assumes that one and only one of an internal node is faulty, it is stuck-at 0 or stuck-at 1. A faulty node is stuck-at 0 or stuck-at 1 and does not change when appropriate. A fault simulator simulates sets of input stimuli to determine which of the modeled stuck-at faults will be detected by a tester for the given set of stimuli. A fault is detected if the response of the circuit with the fault is different from the circuit without manufacturing faults. For instance, if output Zk is 1 for the machine with no errors (i.e. a "good machine") but 0 for the machine with fault fi for a given set of stimuli I then the fault will be detected by the fault simulator after it simulates I.

Suppose a set of stimuli I detects a fault (fi) in original module MX then the same set of stimuli will also detect the fault in the corresponding modules MXa, MXb, and MXc of the larger design. To prove this hypothesis, assume that the fault is detected in the original module MX by observing that Zk is 1 for good machine and is 0 for the machine with fault fi. Following the standard single-stuck-at-fault assumption, assume that the fault fi is in module MXa. Thus Zka will be 0, and Zkb and Zkc will both be 1 for the machine with fault fi in module MXa. Thus, Zka, Zkb, Zkc will all be 1 for the good machine. Therefore, Zk=Zka@Zkb@Zkc will be 1 for good machine and it will be 0 for machine with fault fi in MXA. Thus the fault will be detected for the larger (replicated) design as well.

$$Zk=1\ @1\ @1=1\qquad\text{Equation 5}(a)$$

no errors—good machine $$Zk=0\ @1\ @1=0\qquad\text{Equation 5}(b)$$

machine with fault fi in MXa

Conversely, if the good machine was producing 0 and the machine with fault fi was producing 1 we will have:

$$Zk=0@0@0=0\qquad\text{Equation 6}(a)$$

for a good machine.

$$Zk=1@0@0=1\qquad\text{Equation 6}(b)$$

machine with fault fi in MXa

Thus in either case the fault fi in MXa will be detected.

The same stimuli will also detect fault fi in MXb and MXc. For example, if the fault fi were to be in MXb with the good machine response of 1 and faulty machine response of 0 we will have:

$$Zk=1@1@1=1 \quad \text{Equation 7}(a)$$

good machine $$Zk=1@0@1=0 \quad \text{Equation 7}(b)$$

machine with fault fi in MXb

Thus the fault will be detected by the method described above. This proof will hold as long as the number of replicated modules is odd. Therefore the method taught is accurate as long as the number of replicated modules is odd.

Referring now to FIG. 2a, module MX is shown in the upper left-hand corner. Module MX has three inputs shown as I0, I1 and In. Module MX also has three outputs shown as Z0, Z1 and Zm. The design of module MX can be replicated using an odd number of identical modules. In this case, three modules are used and are identified as MXa, MXb and MXc. Again the inputs are I0, I1 and In.

Although only three inputs and three outputs are shown the method is applicable to a plurality of inputs and a plurality of outputs. The number of inputs and outputs need not be the same. The upper limit of the number of inputs and outputs is not known. The method is applicable to any number of inputs and outputs. Similarly, although the design in this instances is replicated three times, the design may also be replicated any odd number. Theoretically, there is no limit to the number of inputs and outputs which can be replicated. Theoretically, there is no limit to the number of times the design can be replicated. However, the number of replications must be odd.

The output signals of the replicated modules are used as inputs to exclusive OR gates as shown. Exclusive OR gate 205 has output Z0. Similarly, exclusive OR gate 210 has output Z1 and exclusive nor gate 215 has output Zm.

Comparing the output of the original module (Z0, Z1 and Zm) to the outputs of the exclusive or gates (Z0aa, Z0bb, Zmcc) determines if the replicated design is accurate to the original function. If the value of Z0, Z1 and Zm are consistent with the values of Z0aa, Z0bb and Zmcc then the replication of original design MX is accurate. If the output of the original module is consistent with the output of the replicated design then the scaled design accurately reproduces the design of the original module (Mx).

The method of scaling a design for an integrated circuit also is applicable to a bi-directional integrated circuit. FIG. 3a demonstrates replicating the design of a bi-directional integrated circuit. As shown in FIG. 3b, the design of a bi-directional circuit is replicated three times. Again, the number of replications of a bi-directional circuit is not limited. The circuit can be replicated a plurality of times (an odd number) using the method taught. The bi-directional circuit shown has a data signal input (Om) and a control signal input (Cm). However, the method is not limited to a bi-directional circuit having only two inputs. The method is applicable to a bi-directional circuit having a plurality of control and data inputs.

As shown in FIG. 3a, signal Cm is a control signal and signal Om is an output signal. Signals Om and Cm are inputs to a tri-state buffer. Signal Cm is a control input of the tri-state buffer shown. Signal Om is a data input of the tri-state buffer shown. A design for a bi-directional integrated circuit is replicated by using the control signals from each module as inputs to an exclusive OR gate.

Referring to FIG. 3b, the output line of each replicated bi-directional circuit must pass through an exclusive OR gate with the output lines of all other replicated bi-directional circuits. For each bi-directional input and output signal, two exclusive OR gates are required to accurately replicate the design. In FIG. 3b, the exclusive OR gates are represented by exclusive OR gate 310 and exclusive OR gate 320. Exclusive OR gate 310 and exclusive OR gate 320 receive output and input signals from tri-state buffer 305.

Those of skill in the art will recognize that, based upon the teachings herein, several modifications may be made to the embodiments shown in FIGS. 1–3. For example, the number of replications is shown in FIG. 1 as three replications, however, the number is not limited to three replications. Any odd number (i.e., five, seven, nine) can be accomplished using the method described.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of replicating a logical function of a module, comprising:
   providing a number of replicated modules, the number of modules being an odd number, each module replicating the design of the logical function, the logical function having a set of input signals;
   replicating the set of input signals;
   configuring the replicated modules to respectively receive the set of input signals; and
   providing a set of exclusive OR gates, the set of exclusive OR gates equal to a number of outputs of the logical function being replicated, the set of exclusive OR gates receiving a set of output signals from each module, the exclusive OR gates producing a set of output signals.

2. The method as recited in claim 1, further comprising:
   comparing the set of output signals produced by the exclusive OR gates to the set of input signals to the logical function.

3. An integrated circuit designed by replicating a design of a module, the replicated having a set of input signals and a set of output signals, replicating the design accomplished by a method, the method comprising:
   providing a number of modules, wherein the number of modules to be provided is an odd number, each module replicating the design of the module to be replicated;
   replicating the set of input signals;
   configuring the modules to respectively receive the set of input signals; and
   providing a number of exclusive OR gates, the number of exclusive OR gates equal to the number of outputs of the logical function being replicated, the number of exclusive OR gates receiving a set of output signals from the replicated modules, the exclusive OR gates producing a set of output signals.

4. The method as recited in claim 3, further comprising:
   comparing the set of output signals produced by the exclusive OR gates to the set of input signals to the module to be replicated.

5. An integrated circuit designed by replicating a design of a module as recited in claim 3, wherein the integrated circuit includes bi-directional signals.

6. A method of designing an integrated circuit module, the integrated circuit module having a set of input signals and a set of output signals, the method comprising:
- providing a number of replicated modules, each module replicating the design of the module to be replicated, the number of modules being an odd number;
- replicating the set of input signals;
- configuring the replicated modules to respectively receive the set of input signals; and
- providing a number of exclusive OR gates, the number of exclusive OR gates equal to the number of output signals of the module to be replicated, the number of exclusive OR gates receiving a set of output signals from the replicated modules, the exclusive OR gates producing a set of output signals.

7. The method as recited in claim 6, further comprising:
- comparing the set of output signals produced by the exclusive OR gates to the set of input signals to the integrated circuit module to be replicated.

8. A method of designing an integrated circuit module as recited in claim 6, wherein the design of an integrated circuit module to be replicated includes bi-directional signals.

9. A computer program product encoded in computer readable media, the computer program product executable on a computer system, the computer program to replicate a design of an integrated circuit module, the integrated circuit module to be replicated having a set of input signals and a set of output signals, the computer program product comprising:
- a set of instructions, the set of instructions configured to replicate the module to be replicated a number of times, the number of times the module to be replicated being an odd number, each module replicating the design of the module to be replicated;
- replicate the set of input signals;
- configure the modules to respectively receive the set of input signals; and
- provide a number of exclusive OR gates, the number of exclusive OR gates equal to the number of outputs of the module to be replicated, the number of exclusive OR gates receiving a set of output signals from the replicated modules, the exclusive OR gates producing a set of output signals.

10. The computer program as recited in claim 9, further comprising: comparing the set of output signals produced by the exclusive OR gates to the set of input signals to the module to be replicated.

11. The computer program as recited in claim 9, wherein the design of the integrated circuit module to be replicated is the design of a integrated circuit which includes bi-directional signals.

12. A computer system, comprising:
- a processor,
- a display, the display coupled to the processor;
- computer readable medium coupled to the processor; and
- computer code, encoded in the computer readable medium, configured to cause the processor to replicate a design of an integrated circuit module, the integrated circuit module to be replicated having a set of input signals and a set of output signals, the computer code further configured to:
  - stimulate the module to be replicated, the module to be replicated a number of times, the number of times the module to be replicated is an odd number, each replicated module replicating the design of the module to be replicated;
  - replicate the set of input signals;
  - configure the modules to respectively receive the set of input signals; and
  - provide a number of exclusive OR gates, the number of exclusive OR gates equal to the number of output signals of the module to be replicated, the number of exclusive OR gates receiving a set of output signals from the replicated modules, the exclusive OR gates producing a set of output signals.

13. The computer system as recited in claim 12, wherein the computer code is further configured to compare the set of output signals produced by the exclusive OR gates to the set of input signals to the module to be replicated.

14. The computer system as recited in claim 12, wherein the design to be replicated is the design of an integrated circuit having a bi-directional signal.

15. A data processing system, comprising:
- a processor,
- a display, the display coupled to the processor;
- computer readable medium coupled to the processor; and
- computer code, encoded in the computer readable medium, configured to cause the processor to replicate a design of an integrated circuit module, the integrated circuit module to be replicated having a set of input signals and a set of output signals, the computer code further configured to:
  - simulate the module to be replicated, the module to be replicated a number of times, the number of times the module to be replicated is an odd number, each replicated module replicating the design of the module to be replicated;
  - replicate the set of input signals;
  - configure the modules to respectively receive the set of input signals; and
  - provide a number of exclusive OR gates, the number of exclusive OR gates equal to the number of output signals of the module to be replicated, the number of exclusive OR gates receiving a set of output signals from the replicated modules, the exclusive OR gates producing a set of output signals.

16. The data processing system as recited in claim 15, wherein the computer code is further configured to:
- compare the set of output signals produced by the exclusive OR gates to the set of input signals to the logical function.

17. The design of an integrated circuit module, the integrated circuit module to be designed having a set of input and a set of output signals, the design produced by the following method:
- providing a number of replicated modules, each module replicating the design of the module to be replicated, the number of replicated modules being an odd number;
- replicating the set of input signals;
- configuring the replicated modules to respectively receive the set of input signals; and
- providing a number of exclusive OR gates, the number of exclusive OR gates equal to the number of output signals of the module to be replicated, the number of exclusive OR gates receiving a set of output signals from the replicated modules, the exclusive OR gates producing a set of output signals.

18. The design of an integrated circuit module as recited in claim 17, further comprising:
- comparing the set of output signals produced by the exclusive OR gates to the set of input signals to the logical function.

19. A design of an integrated circuit module as recited in claim 17, wherein the integrated circuit module to be designed is a bi-directional integrated circuit module.

* * * * *